United States Patent
Jin et al.

(10) Patent No.: US 9,448,592 B2
(45) Date of Patent: *Sep. 20, 2016

(54) FLEXIBLE DISPLAY PANEL AND DISPLAY APPARATUS INCLUDING THE FLEXIBLE DISPLAY PANEL

(71) Applicant: SAMSUNG DISPLAY CO., LTD., Yongin-si, Gyeonggi-do (KR)

(72) Inventors: Dong-Un Jin, Yongin-si (KR); Woo-Jong Lee, Yongin-si (KR); Yang-Wan Kim, Yongin-si (KR); Young-Sik Kim, Yongin-si (KR); Jun-Sang Lyu, Yongin-si (KR); Sang-Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/275,704

(22) Filed: May 12, 2014

(65) Prior Publication Data
US 2014/0247405 A1    Sep. 4, 2014

Related U.S. Application Data

(63) Continuation of application No. 13/472,443, filed on May 15, 2012, now Pat. No. 8,736,162.

(30) Foreign Application Priority Data

Jun. 30, 2011    (KR) ........................ 10-2011-0065144

(51) Int. Cl.
*H05B 33/12*    (2006.01)
*G06F 1/16*    (2006.01)
(Continued)

(52) U.S. Cl.
CPC ............. *G06F 1/1652* (2013.01); *G06F 1/169* (2013.01); *G06F 1/1626* (2013.01); *G09F 9/301* (2013.01);
(Continued)

(58) Field of Classification Search
None
See application file for complete search history.

(56) References Cited

U.S. PATENT DOCUMENTS 8,188,474 B2    5/2012    Hatano et al.
2008/0007538 A1    1/2008    Kotera et al.
(Continued)

FOREIGN PATENT DOCUMENTS

CN    101106646 A    1/2008
CN    101713874 A    5/2010
(Continued)

OTHER PUBLICATIONS

KIPO Notice of Allowance dated Aug. 23, 2013, for Korean priority Patent Application No. 10-2011-0065144 (2 pages).
(Continued)

*Primary Examiner* — Ashok Patel
(74) *Attorney, Agent, or Firm* — Lewis Roca Rothgerber Christie LLP

(57) ABSTRACT

A flexible display panel including: a flexible substrate including a first region, second regions that extend from the first region and that have a curved surface, and a third region folded towards the second regions; a first display region in the first region of the flexible substrate; a second display region in the second regions of the flexible substrate; a plurality of non-display regions outside the first display region or the second display regions, wherein at least one of the plurality of non-display regions is in the third region of the flexible substrate; and an encapsulation member for encapsulating the first display region and the second display regions.

23 Claims, 12 Drawing Sheets

(51) Int. Cl.
*G09F 9/33* (2006.01)
*G09F 9/30* (2006.01)
*G02F 1/1333* (2006.01)
*G02F 1/1345* (2006.01)
*H01L 51/52* (2006.01)
*H01L 27/32* (2006.01)

(52) U.S. Cl.
CPC ............... *G09F 9/33* (2013.01); *H01L 27/326* (2013.01); *H01L 27/3276* (2013.01); *G02F 1/13338* (2013.01); *G02F 1/13452* (2013.01); *G02F 1/133305* (2013.01); *G02F 2001/13456* (2013.01); *G02F 2001/133311* (2013.01); *G02F 2001/133325* (2013.01); *G02F 2001/133331* (2013.01); *G02F 2001/133388* (2013.01); *G02F 2001/133391* (2013.01); *H01L 27/323* (2013.01); *H01L 27/3267* (2013.01); *H01L 51/5237* (2013.01); *H01L 2251/5338* (2013.01)

(56) References Cited

U.S. PATENT DOCUMENTS

| | | |
|---|---|---|
| 2010/0085320 A1 | 4/2010 | Kuwajima et al. |
| 2010/0096633 A1 | 4/2010 | Hatano et al. |
| 2010/0103138 A1 | 4/2010 | Huang et al. |
| 2010/0293782 A1 | 11/2010 | Yamazaki et al. |
| 2011/0006925 A1 | 1/2011 | Cheng et al. |
| 2011/0050657 A1 | 3/2011 | Yamada |
| 2011/0095975 A1 | 4/2011 | Hwang et al. |
| 2013/0002583 A1* | 1/2013 | Jin et al. ........................ 345/173 |
| 2014/0002385 A1* | 1/2014 | Ka et al. ........................ 345/173 |
| 2014/0016285 A1 | 1/2014 | Miyaguchi |

FOREIGN PATENT DOCUMENTS

| | | |
|---|---|---|
| CN | 101943965 A | 1/2011 |
| JP | 2010-191246 | 9/2010 |
| JP | 2011-00352 | 1/2011 |
| JP | 2011-3537 A | 1/2011 |
| JP | 2011-34066 | 2/2011 |
| JP | 2011-047976 | 3/2011 |
| KR | 10-0920479 | 7/2004 |
| KR | 10-2007-0040268 A | 4/2007 |
| KR | 10-2008-0096063 A | 10/2008 |
| KR | 10-2011-0048640 | 5/2011 |
| TW | 201017499 A | 5/2010 |

OTHER PUBLICATIONS

KIPO Office action dated Feb. 26, 2013, for Korean priority Patent Application 10-2011-0065144, 6 pages.
English Machine translation of MO (KR 2009-011652).
Korean Patent Abstracts for Publication No. KR-2004-0057801, dated Jul. 2, 2004 for Patent No. KR 10-0920479 A.
English translation of Taiwan Office action dated May 18, 2016, for corresponding Taiwanese Patent application 101123346 (22 pages), previously submitted on Jun. 13, 2016.
English Translation of Chinese Office action dated Jul. 18, 2016, issued in corresponding CN Patent Application No. 201210226638. 8, previously submitted on Jul. 22, 2016.

* cited by examiner

FLEXIBLE DISPLAY PANEL AND DISPLAY APPARATUS INCLUDING THE FLEXIBLE DISPLAY PANEL

CROSS-REFERENCE TO RELATED PATENT APPLICATION

This application is a continuation of U.S. patent application Ser. No. 13/472,443, filed May 15, 2012, which claims priority to and the benefit of Korean Patent Application No. 10-2011-0065144, filed on Jun. 30, 2011, in the Korean Intellectual Property Office, the contents of both are incorporated herein in their entirety by reference.

BACKGROUND

1. Field

One or more embodiments of the present invention relate to a flexible display panel and a display apparatus including the flexible display panel.

2. Description of Related Art

Display apparatuses refer to apparatuses that display an image signal. Such display apparatuses include televisions (TVs), computer monitors, personal digital assistants (PDAs) and smart devices that are increasingly in demand, which display an image signal input by an external device.

A flat panel display module with high image quality, such as an organic light-emitting display panel, a liquid crystal display (LCD) panel, a plasma display panel (PDP), or the like, is used in display apparatuses.

The flat panel display module includes a display region in which an image is displayed, and a non-display region in which various circuits and wirings for supplying an image signal to the display region are located. In this regard, the non-display region is outside the display region on the same plane as that of the display region.

As demand for high image quality and various applications of display apparatuses is recently increasing, the number of circuits and wirings located in the non-display region of the flat panel display module is also increasing. Thus, the area of the non-display region has increased, which causes a reduction in the percentage of the display region that is seen by a user.

In the case of a smart phone that has a much smaller display screen than a computer monitor, various methods of enlarging the display screen have been researched.

SUMMARY

One or more embodiments of the present invention provide a flexible display panel that allows a user to feel a sense of beauty by adding a design of a curved surface and significantly decreases the ratio of non-display regions to a display region recognized by a user, and a display apparatus including the flexible display panel.

According to an aspect of the present invention, there is provided a flexible display panel including: a flexible substrate including a first region, second regions that extend from the first region and that have a curved surface, and a third region folded towards the second regions; a first display region in the first region of the flexible substrate; second display regions in the second regions of the flexible substrate; a plurality of non-display regions outside the first display region or the second display regions, wherein at least one of the plurality of non-display regions is in the third region of the flexible substrate; and an encapsulation member for encapsulating the first display region and the second display regions.

The first display region and the second display regions may be continuous in the flexible substrate without forming a border between the first and second display regions.

Input signals input by the same input signal input unit may be displayed in the first display region and the second display regions.

Input signals input by different image signal input units may be displayed in the first display region and the second display regions.

The curved surface of the second display regions may have a predetermined curvature radius.

The curvature radius may be greater than or equal to 0.01 mm and may be less than or equal to 20 mm.

The curved surface may be a portion of a circumference of a circle that has a predetermined constant curvature radius.

An angle formed from a boundary between the first display region and the second display regions to an edge of the second display regions may be between 0° and 90°.

The first region may be constantly flat.

The third region may be folded not to be recognized in a direction in which the first region is displayed.

The third region may be folded to be parallel to a surface of the first region.

At least one of the first display region and the second display regions may include an organic light-emitting device.

The flexible display panel may further include a barrier layer located between the flexible substrate, the first display region and the second display regions.

The encapsulation member may be a flexible encapsulation thin layer.

The flexible display panel may further include a support unit for maintaining a shape of the flexible display panel.

The support unit may be a transparent protection window located on the encapsulation member.

The flexible display panel may further include a touch panel located on at least one side of the flexible substrate and the encapsulation member, in which images of the first and second display regions are displayed.

The touch panel may include a flexible film that can be folded to correspond to a shape of the flexible display panel.

The touch panel may include: touch regions in the flexible film that correspond to the first display region and the second display regions; and wiring regions outside the touch regions.

According to another aspect of the present invention, there is provided a flexible display panel including: a first display region; second display regions that extend from the first display region and that have a predetermined curved surface; and non-display regions that are folded towards the first display region from the second display regions and being not recognized from a front of the first display region.

The second display region may immediately follow the first display region without forming a border between the first and second display regions.

An angle formed from a boundary between the first display region and the second display regions to an edge of the second display regions may be between 0° and 90°.

The non-display regions may be folded to be parallel to the first display region.

According to another aspect of the present invention, there is provided a display apparatus including: a flexible display panel including a first display region, second display regions that extend from the first display region and that have a predetermined curved surface and non-display regions folded towards the first display region from the second display region and being not recognized from a front of the first display region; and a support member for maintaining a shape of the flexible display panel.

The display apparatus may further include: an encapsulation thin layer for encapsulating the first display region and the second display region; and a touch panel located on the encapsulation thin layer and including touch regions corresponding to the first display region and the second display regions, wherein at least one organic light-emitting device is located in the first display region or the second display region.

The display apparatus may further include a transparent protection window located on the touch panel to correspond to shapes of the first display region and the second display regions of the flexible display panel and the touch panel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings in which exemplary embodiments of the invention are shown.

Figure 1:
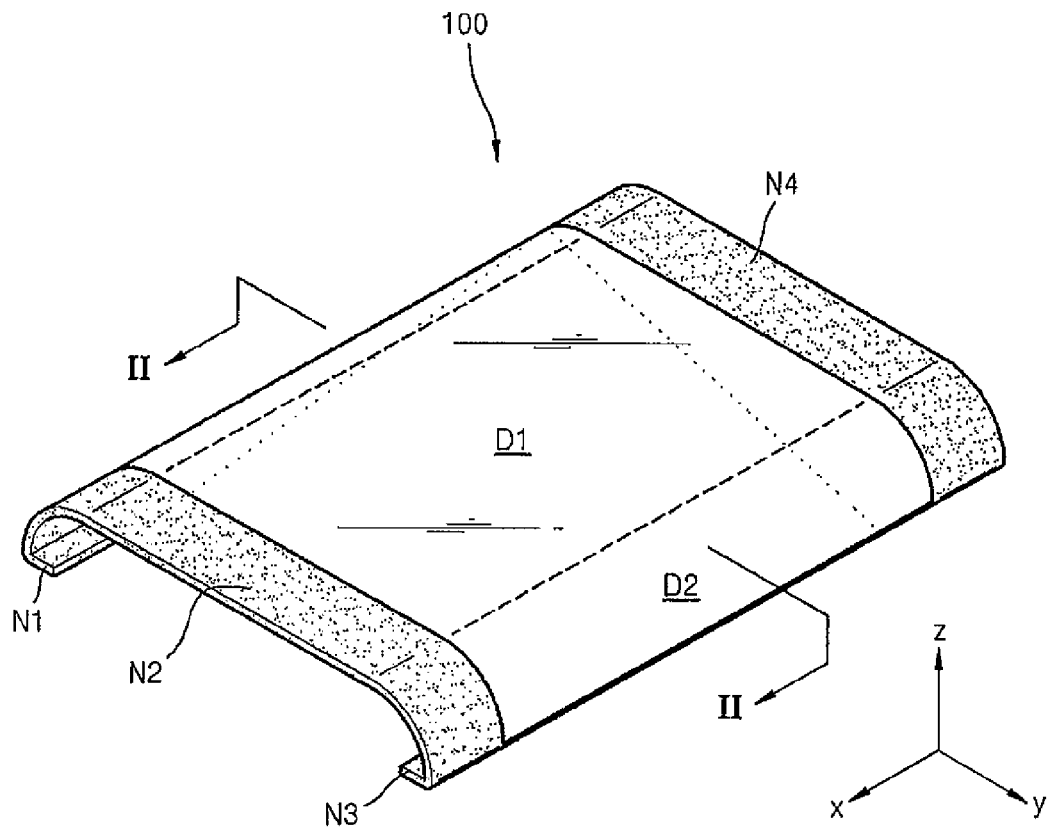
FIG. 1 is a schematic perspective view of a flexible display panel according to an embodiment of the present invention.
Figure 2:
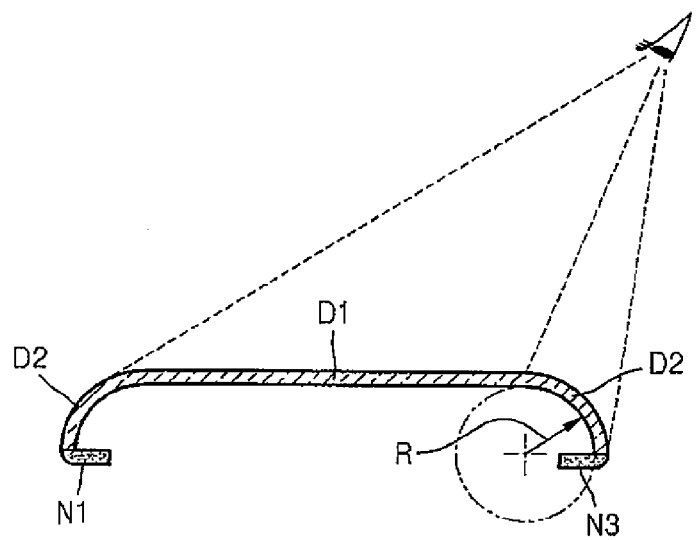
FIG. 2 is a cross-sectional view of the flexible display panel illustrated in FIG. 1, taken along a line II-II of FIG. 1.

FIG. 1 is a schematic perspective view of a flexible display panel 100 according to an embodiment of the present invention, and FIG. 2 is a cross-sectional view of the flexible display panel 100 illustrated in FIG. 1, taken along a line of FIG. 1.

Referring to FIGS. 1 and 2, the flexible display panel 100 includes a first display region D1, second display regions D2 on right and left sides of the first display region D1, and non-display regions N1, N2, N3, and N4 outside the first display region D1 or each of the second display regions D2.

The first display region D1 is generally flat over its entire area and may be a main display screen of the flexible display panel 100.

Each of the second display regions D2 faces a different direction from the first display region D. For example, each of the second display regions D2 is formed as a curved surface that has a curvature radius R. In one embodiment, for example, the curvature radius R is greater than or equal to about 0.01 mm and less than or equal to about 20 mm. When the curvature radius R is less than 0.01 mm, the flexible display panel 100 may not maintain a curved state due to bending stress, and when the curvature radius R is greater than 20 mm, a sense of grip and/or a sense of aesthetic may be reduced.

The curvature radius R may have a constant value. Thus, the curved surface may be a portion of the circumference of a circle or an arc.

Each of the second display regions D2 extends from the first display region D1 and is adjacent to and integral with the first display region D1 without a distinguishable border between the first display region D1 and the second display regions D2. In this regard, the curved surface may be formed less than a quarter of the circumference of a circle. In other words, an angle formed from a boundary between the first display region D1 and the second display regions D2 to an edge of the second display region D2 may be between about 0° and about 90°.

The second display region D2 may be an auxiliary display screen of the flexible display panel 100. As described above, because the second display region D2 extends from the first display region D1 as a curved surface that has a curvature radius R, a user recognizes that a display screen of the flexible display panel 100 is not limited to the first display region D1 but is extended due to the second display region D2. In other words, the size of the entire display screen may be increased due to the second display region D2.

When the flexible display panel 100 is installed in a small handheld display apparatus, such as a cellular phone or a personal digital assistant (PDA), the second display region D2 is formed as a curved surface so that gripping of the device may be improved and an aesthetic due to the curved surface may be increased.

The non-display regions N1, N2, N3, and N4 are outside the first display region D1 or the second display region D2. In the current embodiment, the non-display regions N1 and N3 are outside the second display regions D2, and the non-display regions N2 and N4 are outside the first display region D1.

In particular, in the current embodiment, the non-display regions N1 and N3 that face each other in right and left directions of the first display region D1 are folded to be substantially parallel to the first display region D1. In other words, each of the non-display regions N1 and N3 is substantially parallel to the first display region D1. Thus, the user does not see the non-display regions N1 and N3 on right and left sides of the first display region D1 from a front of the first display region D1. Thus, it will appear to the user that the second display region D2 defined by the non-display regions N1 and N3 is almost borderless. In detail, the flexible display panel 100 according to the current embodiment may be a display screen maximized by a minimized size of the non-display regions N1 and N3.

In the current embodiment, the non-display regions N2 and N4 that face each other in upward and downward directions of the first display region D1 are substantially parallel to the first display region D1. However, the present invention is not limited thereto. For example, the non-display regions N2 and N4 that face each other in upward and downward directions of the first display region D1 may be further folded in a direction opposite to a direction in which the first display region D1 is displayed. In this regard, it may appear to the user that the second display region D2 formed by the non-display regions N1 and N3 is almost borderless. Thus, a display screen enlarged by a minimized size of the non-display regions N2 and N4 may be implemented.

Figure 3:
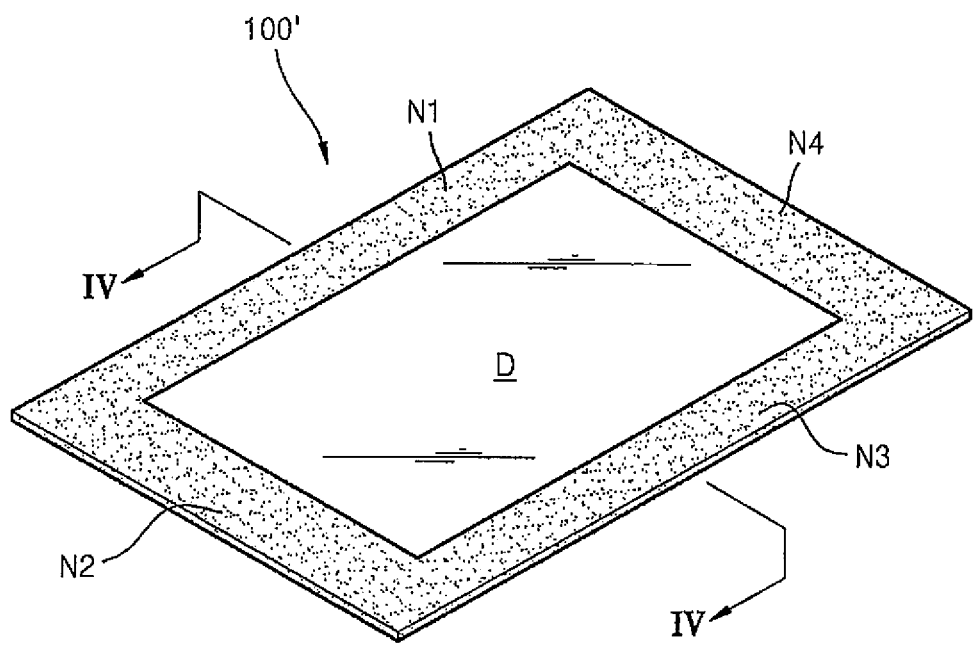
FIG. 3 is a schematic perspective view of a flexible display panel as a comparative embodiment for comparison to the embodiment of FIG. 1.
Figure 4:
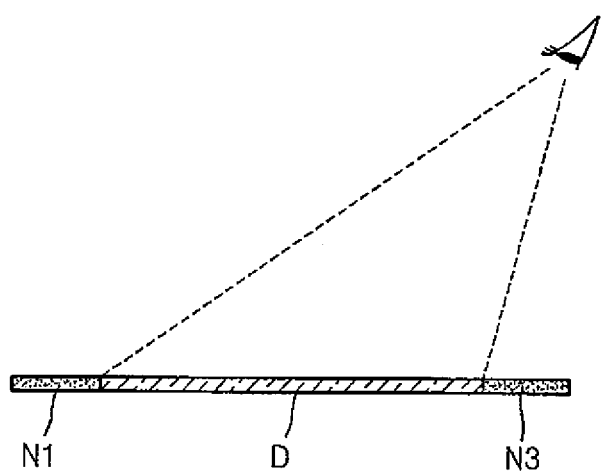
FIG. 4 is a cross-sectional view of the flexible display panel illustrated in FIG. 3, taken along a line IV-IV of FIG. 3.

FIG. 3 is a is a schematic perspective view of a flat display panel 100' in which the second display region D2 of FIG. 1 is not included and non-display regions N1, N2, N3, and N4 are not folded, as a comparative embodiment for comparison to the embodiment of FIG. 1, and FIG. 4 is a cross-sectional view of the flat display panel 100' illustrated in FIG. 3, taken along a line IV-IV of FIG. 3.

Referring to FIGS. 3 and 4, the flat display panel 100', in which the non-display regions N1, N2, N3, and N4 are not folded, includes a display region D and non-display regions N1, N2, N3, and N4 outside the display region D.

Because the flat display panel 100' of FIG. 3 does not include the second display region D2 of FIG. 1 described above, a display screen cannot be maximized in size. In addition, because the second display region D2 is not formed as a curved surface, a grip or a sense of beauty cannot be enhanced.

In addition, because the non-display regions N1 and N3 are not folded, when the user sees the flat display panel 100' from the front (z-direction) of the display region D, the user can see the original width of the non-display regions N1 and N3 as a border that surrounds the upper and lower sides of the display region D. Thus, a display screen enlarged by a degree at which the non-display regions N1 and N3 are not seen by the user cannot be implemented.

Figure 5:
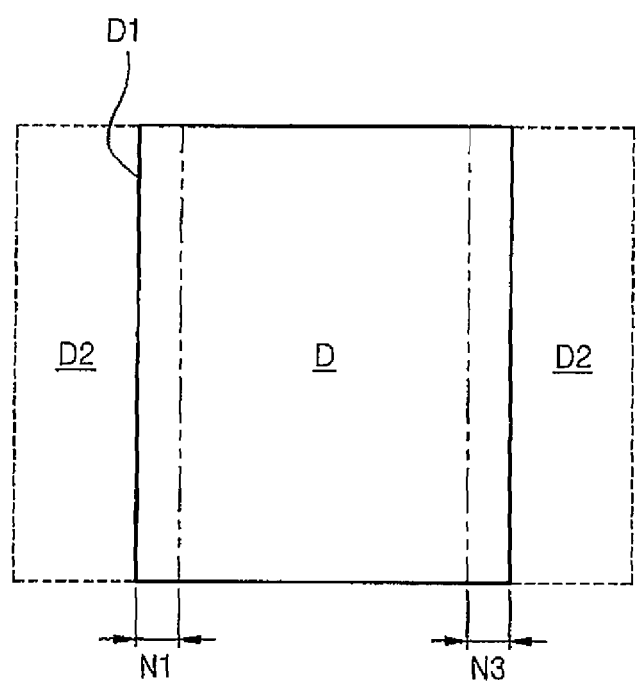
FIG. 5 illustrates a comparison of a display region of the flexible display panel illustrated in FIGS. 1 and 2 and a display region of the flexible display panel according to the comparative embodiment of FIGS. 3 and 4.

FIG. 5 illustrates a comparison of a display region of the flexible display panel 100 illustrated in FIGS. 1 and 2 and a display region of the flexible display panel 100' according to the comparative embodiment of FIGS. 3 and 4.

Referring to FIG. 5, the flexible display panel 100 illustrated in FIGS. 1 and 2 includes the first display region D1 and the second display regions D2 on right and left sides of the first display region D1. The flexible display panel 100' according to the comparative embodiment of FIGS. 3 and 4 includes only one display region D.

Thus, the flexible display panel 100 illustrated in FIGS. 1 and 2 may be a display screen enlarged by the second display region D2. Furthermore, when the sizes of the flexible display panel 100 of FIGS. 1 and 2 and the flexible display panel 100' of FIGS. 3 and 4 are the same from their front, the non-display regions N1 and N3 according to the comparative embodiment of FIGS. 3 and 4 are not seen in FIGS. 1 and 2. Thus, a screen of the first display region D1 of FIGS. 1 and 2 is maximized by the size of the non-display regions N1 and N3, compared to the display region D of FIGS. 3 and 4.

In the case of the flat display panel 100' according to the comparative embodiment, in order to minimize the area of the non-display regions N1 and N3, the number of various circuits or wirings located in the non-display regions N1 and N3 has to be minimized, or line widths of circuits or wirings have to be minimized. However, because demand for high image quality and various applications of a display apparatus is increasing, there is a limitation in reducing the number of circuits or wirings. In addition, there is a process difficulty in reducing line widths of the circuits or wirings. However, in the flexible display panel 100 of FIG. 1, the area of the non-display regions N1 and N3 recognized by the user may be minimized without reducing the number of circuits or wirings located in the non-display regions N1 and N3 or without reducing line widths of the circuits or wirings.

Figure 6:
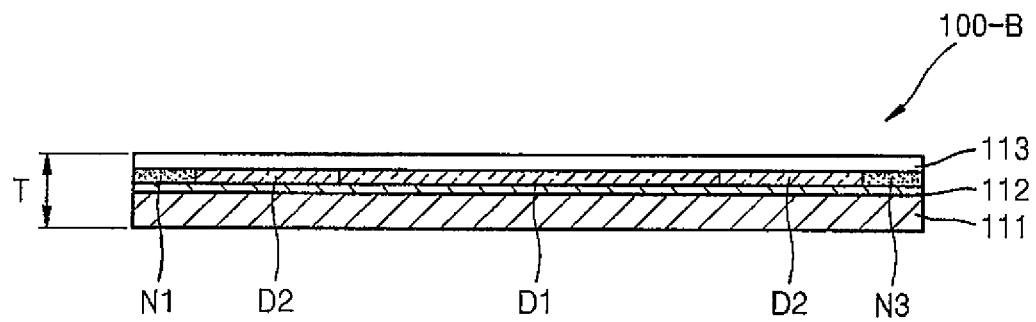
FIG. 6 is a schematic cross-sectional plane view of an example of a flexible display panel before non-display regions of FIG. 1 are folded.
Figure 7:
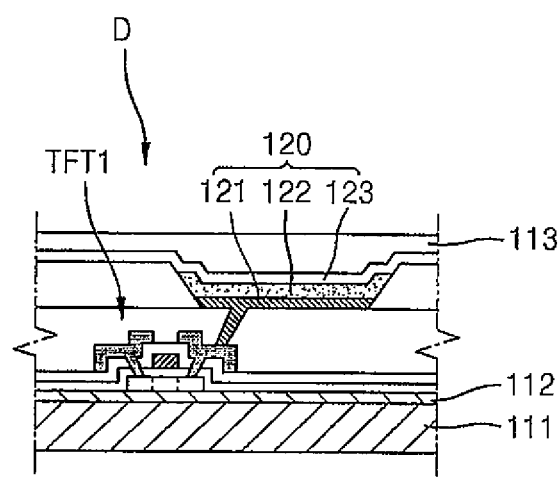
FIG. 7 is a partial cross-sectional view of an example of a first display region and/or a second display region of the flexible display panel illustrated in FIG. 6.
Figure 8:
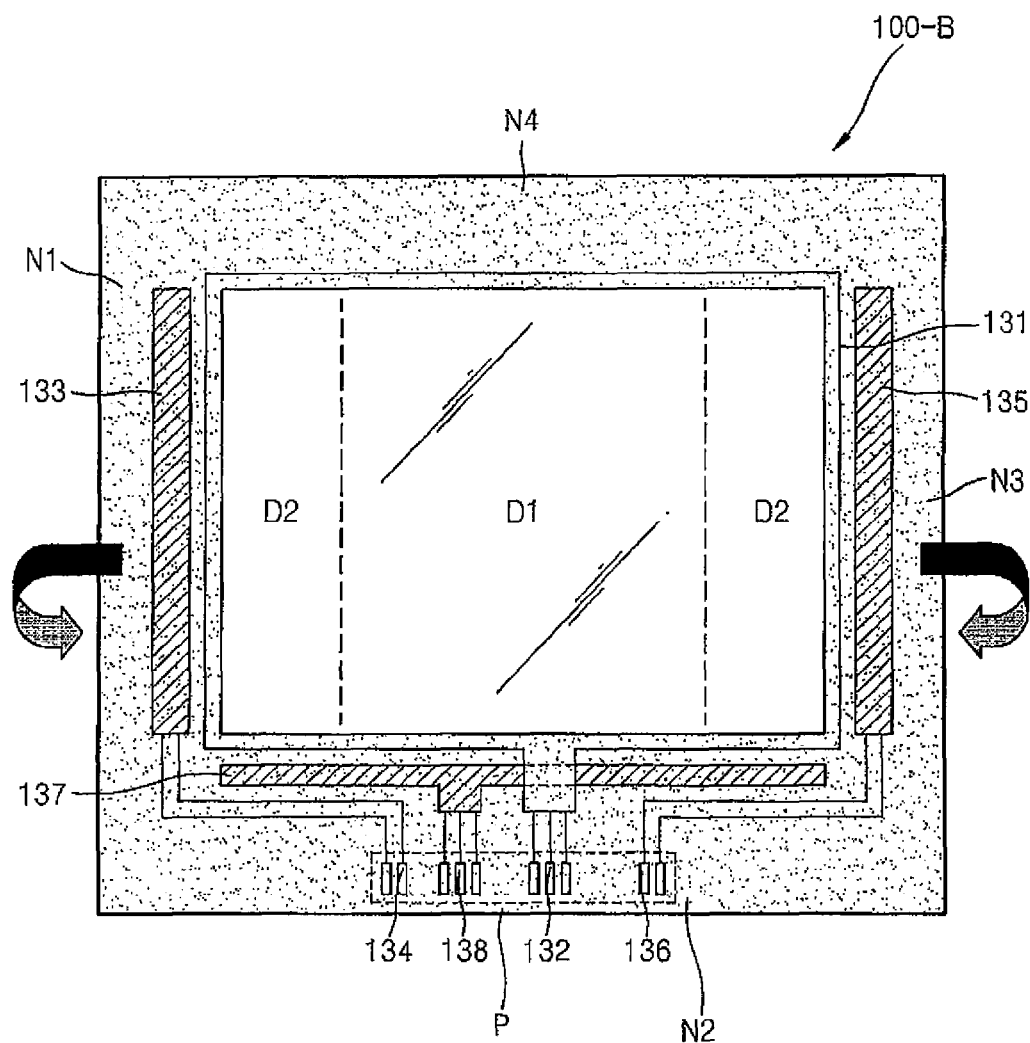
FIG. 8 is a plane view of an example of non-display regions of the flexible display panel illustrated in FIG. 6.

FIG. 6 is a schematic cross-sectional plane view of an example of a flexible display panel 100-B before the non-display regions N1 and N3 of FIG. 1 are folded, and FIG. 7 is a partial cross-sectional view of an example of the first display region D1 and/or the second display regions D2 of FIG. 6, and FIG. 8 is a plane view of an example of the non-display regions N1, N2, N3, and N4 of FIG. 6.

Referring to FIGS. 6 through 8, the flexible display panel 100-B before the non-display regions N1 and N3 are folded includes a flexible substrate 111, a barrier layer 112 located on the flexible substrate 111, the first display region D1, the second display regions D2, and the non-display regions N1, N2, N3, and N4 located on the barrier layer 112, and an encapsulation member 113.

The flexible substrate 111 may be formed of a plastic material having excellent heat resistance and durability, such as polyethylene ether phthalate, polyethylene naphthalate, polycarbonate, polyarylate, polyetherimide, polyethersulfone, polyimide, or the like. However, the present invention is not limited thereto, and the flexible substrate 111 may be formed of various flexible materials.

The barrier layer 112 may be located on the flexible substrate 111. The barrier layer 112 may be formed of at least one of an inorganic layer and an organic layer. The barrier layer 112 prevents unnecessary components from transmitting into the flexible substrate 111 and from permeating into the first and second display regions D1 and D2.

The first display region D1, the second display regions D2, and the non-display regions N1, N2, N3, and N4 outside the first display region D1 and the second display regions D2 may be located on the barrier layer 112.

An image signal is displayed in the first display region D1. The first display region D1 may be a main display screen. Various display devices, such as organic light-emitting display devices, liquid crystal display (LCD) devices, electrophoresis devices, and the like may be located in the first display region D1. In the current embodiment, an organic light-emitting device 120 will be described. Various devices, such as thin film transistors (TFTs) and capacitors for driving display devices, and the like may also be located in the first display region D1.

Each of the second display regions D2 extends from right and left sides of the first display region D1. An image signal is displayed in the second display region D2, which may be an auxiliary display screen. Like in the first display region D1, various display devices, such as organic light-emitting display devices, liquid crystal display (LCD) devices, electrophoresis devices, and the like may be located in the second display region D2. In the current embodiment, an organic light-emitting device 120 will be described. Various devices, such as thin film transistors (TFTs) and capacitors for driving the display devices, and the like may also be located in the second display region D2.

Referring to FIG. 7, at least one organic light-emitting device 120 is located in the first display region D1 or the second display regions D2. The organic light-emitting device 120 includes a pixel electrode 121, an opposite electrode 123 that is a common layer, and an organic emission layer 122 located between the pixel electrode 121 and the opposite electrode 123. The pixel electrode 121 is electrically connected to a driving thin film transistor TFT1 located on the flexible substrate 111. Although not shown in FIG. 7, the organic light-emitting device 120 is electrically connected to at least one switching thin film transistor and storage capacitor, thereby emitting light from the first display region D1 or the second display regions D2.

Light may be emitted from the organic emission layer 122 located in the first display region D1 towards the flexible substrate 111 or the encapsulation member 113. In the current embodiment, a top-emission type display device in which an image is displayed towards the encapsulation member 113 is described. However, the present invention is not limited thereto and may be applied to a bottom-emission type display device in which an image is displayed towards the flexible substrate 111.

Light may be emitted from the organic emission layer 122 located in the second display regions D2 towards outsides of the second display regions D2.

Various circuits and wirings for supplying an image signal to the organic light-emitting device 120 located in the first display region D1 or the second display regions D2 may be located in the non-display regions N1, N2, N3, and N4.

Referring to FIG. 8, an electrode power supply line 131 for supplying power to the opposite electrode 123, and a terminal portion 132 of the electrode power supply line 131 are located in the non-display regions N1, N2, N3, and N4. A scan circuit unit 133 for transmitting a driving signal to the display region D and a terminal portion 134 of the scan circuit unit 133 are located in the non-display regions N1 and N2. A data circuit unit 135 for transmitting a data signal to the display region D and a terminal portion 136 of the data circuit unit 135 are located in the non-display regions N2 and N3. A driving power wiring unit 137 for supplying driving power to the display region D and a terminal portion 138 of the driving power wiring unit 137 are located in the non-display region N2. A pad unit P, on which the terminal portions 132, 134, 136, and 138 are located, is located in the non-display region N2.

In the current embodiment, image signals input by the same electrode power supply line 131, the scan circuit unit 133, the data circuit unit 135 and the driving power wiring unit 137 are supplied to the first display region D1 and the second display region D2. In other words, the image signals input by the same image signal input unit are displayed in the first display region D1 and the second display region D2. Thus, all of the first display region D1 and the second display region D2 function as one display screen.

However, the present invention is not limited thereto. Image signals input by different image signal input units may be displayed in the first display region D1 and the second display region D2.

Figure 9:
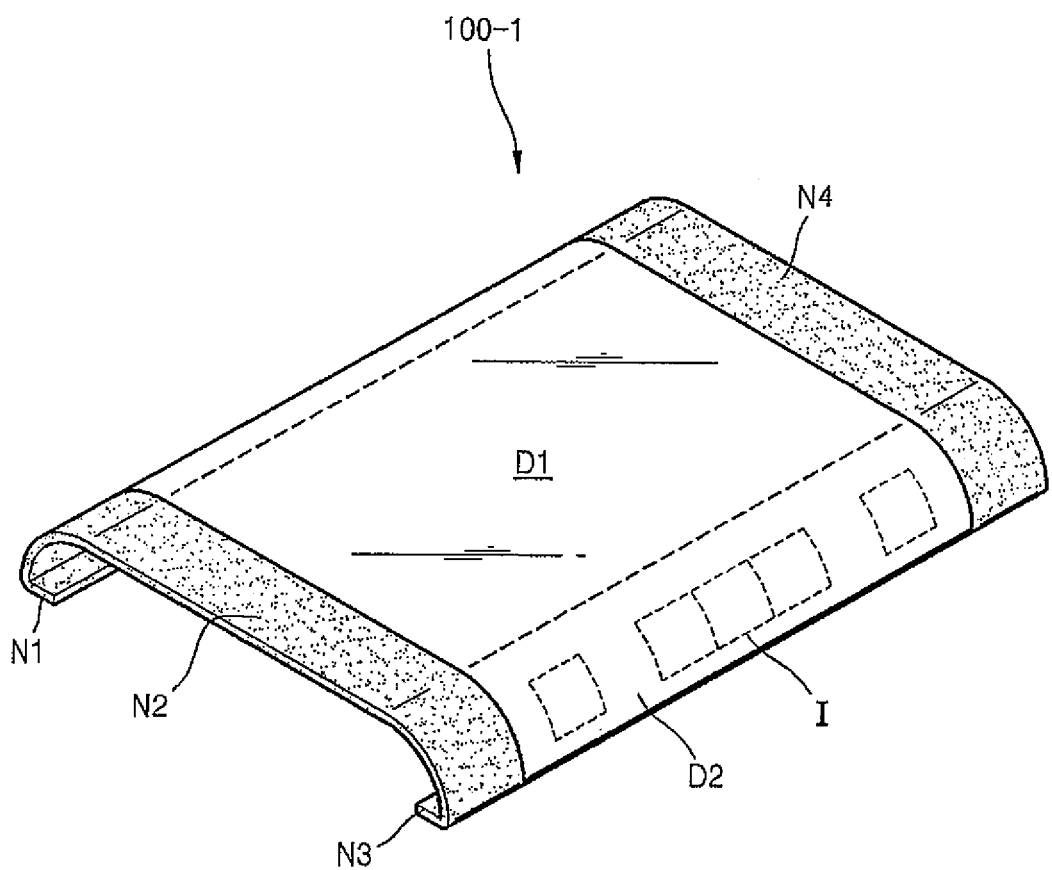
FIG. 9 is a schematic perspective view of a flexible display panel in which image signals input by different image signal input units are displayed in a first display region and a second display region.

FIG. 9 is a schematic perspective view of a flexible display panel 100-1 in which image signals input by different image signal input units are displayed in the first display region D1 and the second display region D2.

Referring to FIG. 9, the first display region D1 may represent a main screen, and the second display region D2 may represent an auxiliary screen, such as a screen on which various icons I are displayed. In this regard, the first display region D1 and the second display region D2 may be connected to the separate electrode power supply line 131, the scan circuit unit 133, the data circuit unit 135 and the driving power wiring unit 137, unlike in FIG. 8.

Various circuits, wirings, and terminal portions illustrated in FIG. 8 are just illustrative of an example of the non-display regions N1, N2, N3, and N4. In other words, obviously, various other circuits, wirings, and terminal portions may be located in the non-display regions N1, N2, N3, and N4.

Referring back to FIG. 6, the encapsulation member 113 for encapsulating at least the first display region D1 and the second display region D2 may be located in the first display region D1, the second display region D2, and the non-display regions N1, N2, N3, and N4. The encapsulation member 113 may be an encapsulation thin layer. The encapsulation thin layer may have a structure including a plurality of inorganic layers or a structure in which an inorganic layer and an organic layer are alternately stacked.

Referring to FIG. 6, the flexible display panel 100-B has a thickness T. The thickness T may be obtained by summing up the thicknesses of the flexible substrate 111, the barrier layer 112, the first display region D1, the second display region D2, and the non-display regions N1, N2, N3, and N4 and the encapsulation member 113. A protective film may be further located on the flexible substrate 111 and/or the encapsulation member 113. In this regard, the thickness T of the flexible display panel 100-B may be greater than as shown in FIG. 6.

When the second display regions D2 on right and left sides of the first display region D1 of the flexible display panel 100-B illustrated in FIG. 8 are folded to have a predetermined curvature radius R and the non-display regions N1 and N3 connected to the second display regions D2 are folded to be parallel to the first display region D1, the flexible display panel 100 illustrated in FIGS. 1 and 2 is formed.

In the flexible display panel 100, the second display region D2 is formed as a curved surface. The second display region D2 may be all of curved surface or a part of the curved surface.

Figure 10:
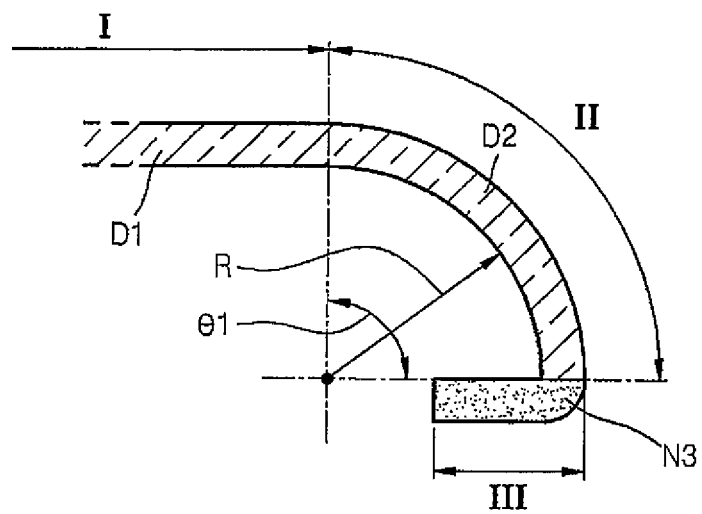
FIGS. 10 and 11 are schematic cross-sectional views illustrating the relationship between the second display region and the non-display regions.

Referring to FIG. 10, the first display region D1 is in the first region I of the flexible display panel 100-B, and the second display region D2 is in the entire second region II to form a quarter of the circumference of a circle that has the predetermined curvature radius R. The non-display region N3 is in the entire third region III to be substantially parallel to the first region I.

In other words, the second region II is formed as a curved surface that has a predetermined curvature radius R, and an angle θ1 formed from a boundary between the first region I and the second region II to an edge of the second display region D2 in the second region II is 90°.

Figure 11:
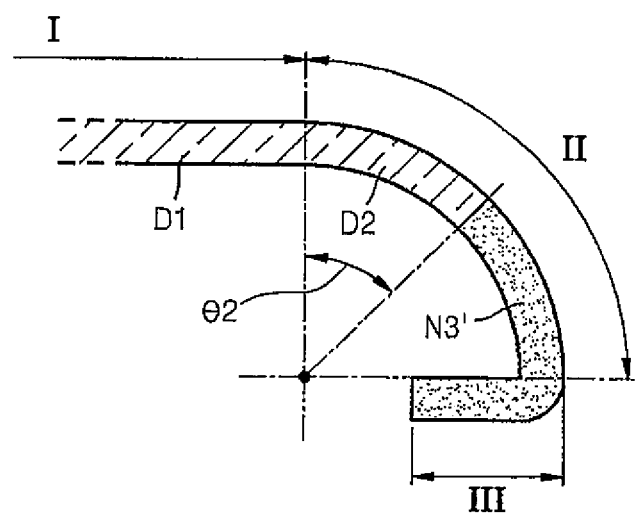

Referring to FIG. 11, the first display region D1 is in the first region I of the flexible display panel 100-B, and the second display region D2 is in a portion of the second region II to form a quarter of the circumference of a circle that has a predetermined curvature radius R. A non-display region N3' is both in the second region II and the third region III.

In other words, the second region II is formed as a curved surface that has a predetermined curvature radius R, and an angle θ2 formed from a boundary between the first region I and the second region II to an edge of the second display region D2 in the second region II is less than 90°.

In the flexible display panel 100 illustrated in FIGS. 1 and 2 described above, the second display regions D2 are on right and left sides of the first display region D1. However, the present invention is not limited thereto. In other words, the spirit of the present invention also applies to a case where the second display region D2 is on any one of the right and left sides of the first display region D1.

In addition, in the case of the flexible display panel 100 of FIG. 1 described above, the non-display regions N1 and N3 on the right and left sides of the second display region D2 are folded. However, the present invention is not limited thereto. In other words, the spirit of the present invention also applies to a case where any one of the non-display regions N1 and N3 is folded.

Figure 13:
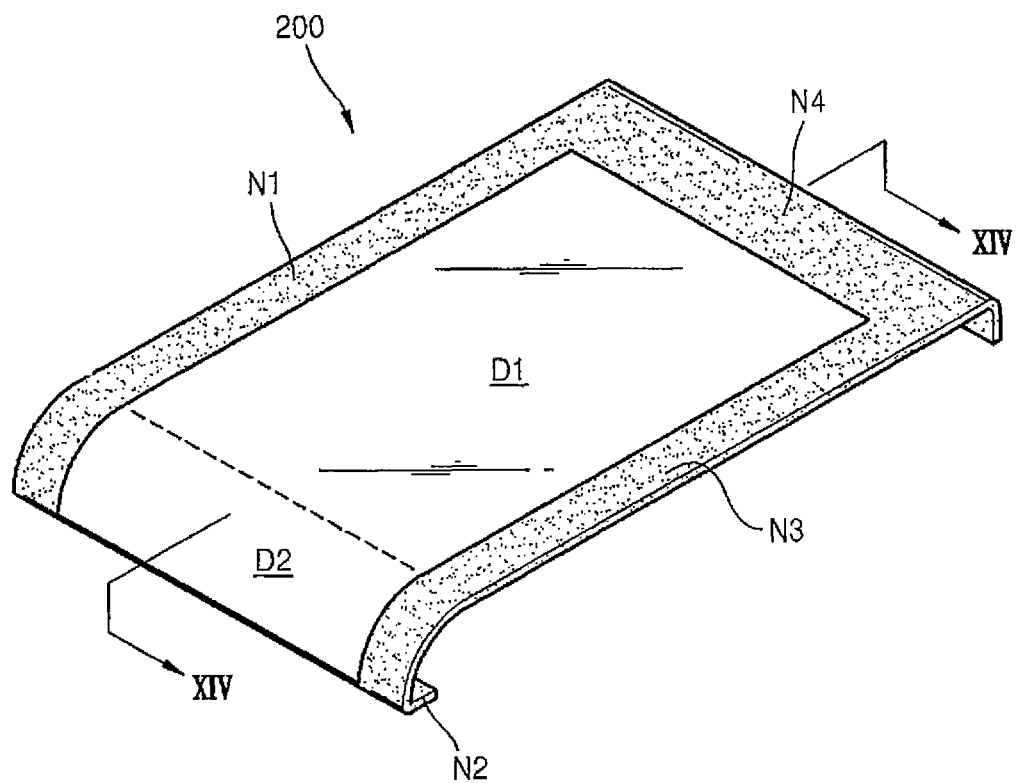
FIG. 13 is a schematic perspective view of a flexible display panel according to another embodiment of the present invention.
Figure 14:
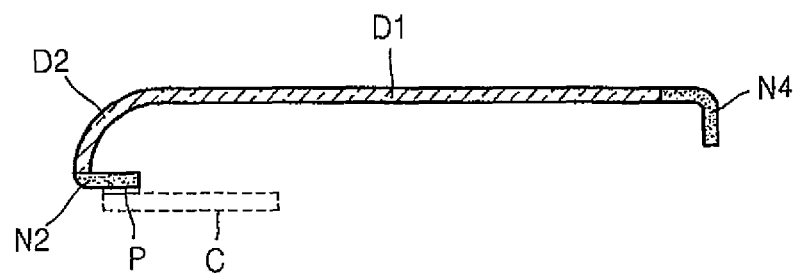
FIG. 14 is a cross-sectional view of the flexible display panel illustrated in FIG. 13, taken along a line XIV-XIV of FIG. 13.

FIG. 13 is a schematic perspective view of a flexible display panel 200 according to another embodiment of the present invention, and FIG. 14 is a cross-sectional view of the flexible display panel 200 illustrated in FIG. 13, taken along a line XIV-XIV of FIG. 13.

Hereinafter, the current embodiment will be described with respect to its differences to the embodiments of FIGS. 1 and 13.

Referring to FIGS. 13 and 14, the flexible display panel 200 includes a first display region D1, a second display region D2 connected to one side of the first display region D1, and non-display regions N1, N2, N3, and N4 outside the first display region D1 and the second display region D2.

The first display region D1 may be a main display screen of the flexible display panel 200.

The second display region D2 may be an auxiliary display screen of the flexible display panel 200. Because the second display region D2 extends from the first display region D1 as a curved surface that has a predetermined curvature radius, the user sees that a display screen of the flexible display panel 200 is not limited to the first display region D1 but is extended due to the second display region D2. In other words, the display screen of the flexible display panel 200 may be increased due to the second display region D2. In addition, because the second display region D2 is formed as a curved surface, the device may be easier to grip, and an aesthetic due to the curved surface may be increased.

The non-display region N2 extends from the second display region D2, and the non-display regions N1, N3 and N4 are outside the first display region D1.

The non-display region N2 is folded inwards to be substantially parallel to the first display region D1 In other words, the non-display region N2 is folded to be substantially parallel to the first display region D1. Thus, the user does not see the non-display region N2 from a front of the first display region D1. Also, the user may see that the second display region D2 defined by the non-display region N2 is borderless. In other words, the flexible display panel 200 according to the current embodiment may be a display screen enlarged by a minimized size of the non-display region N2.

Figure 12:
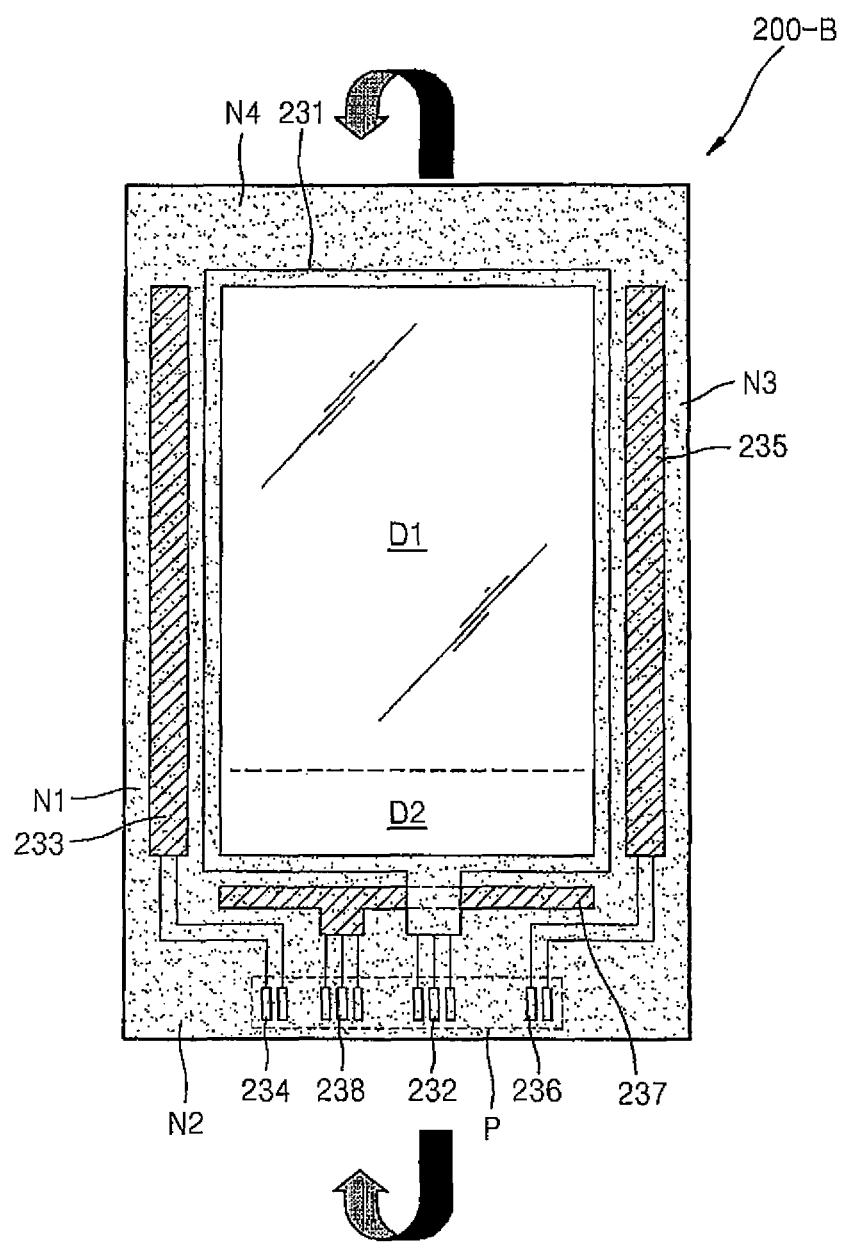
FIG. 12 is a schematic plane view of an example of a flexible display panel before non-display regions of FIG. 13 are folded.

The above-described pad unit P illustrated in FIG. 12 may be located in the non-display region D2. In this regard, an external driver may be installed on the pad unit P or a connector C may be connected to the pad unit P. Because the external driver or the connector C is connected to an inside of the flexible display panel 200, there is no portion in which the external driver or the connector C is folded so the area of the non-display region N2 may be further reduced.

In the case of the above-described flexible display panel 200 illustrated in FIG. 13, the second display region D2 is on one side of the first display region D1. However, the present invention is not limited thereto. In other words, the spirit of the present invention also applies to a case where the second display region D2 is on upper and left sides of the first display region D1. In addition, the spirit of the present invention also applies to a case where the second display region D2 is on upper and left sides and right and left sides of the first display region D1.

Figure 15:
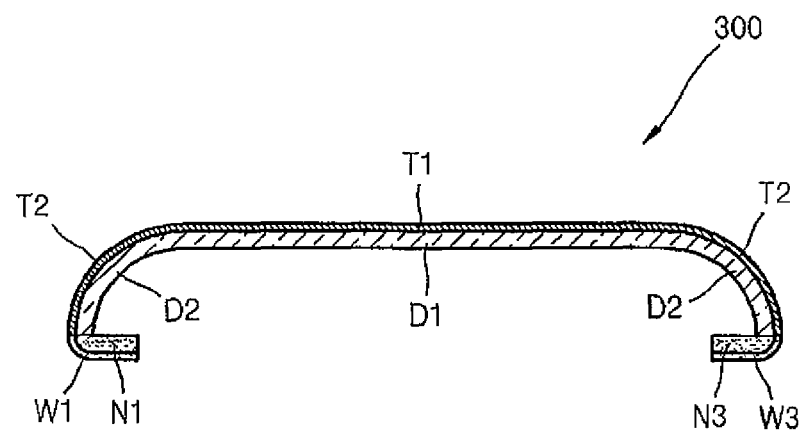
FIG. 15 is a cross-sectional view of a flexible display panel-integrated touch panel according to another embodiment of the present invention.
Figure 16:
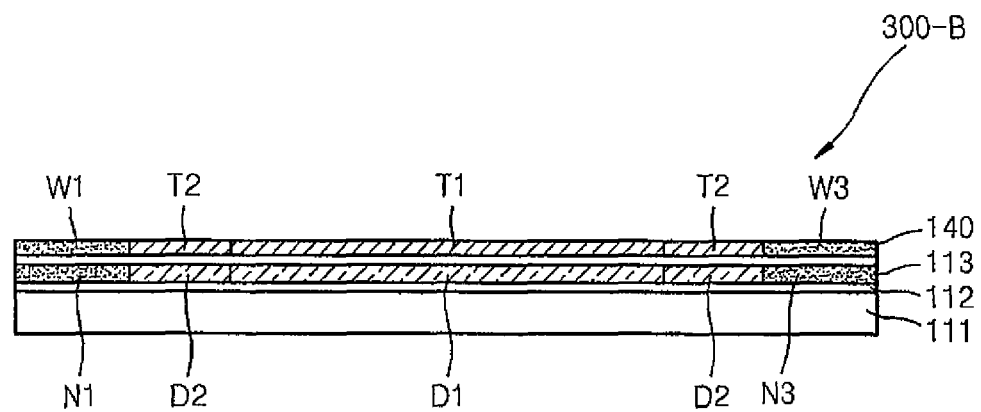
FIG. 16 is a cross-sectional view of a flexible display panel-integrated touch panel before non-display regions of the flexible display panel-integrated touch panel illustrated in FIG. 15 are folded.
Figure 17:
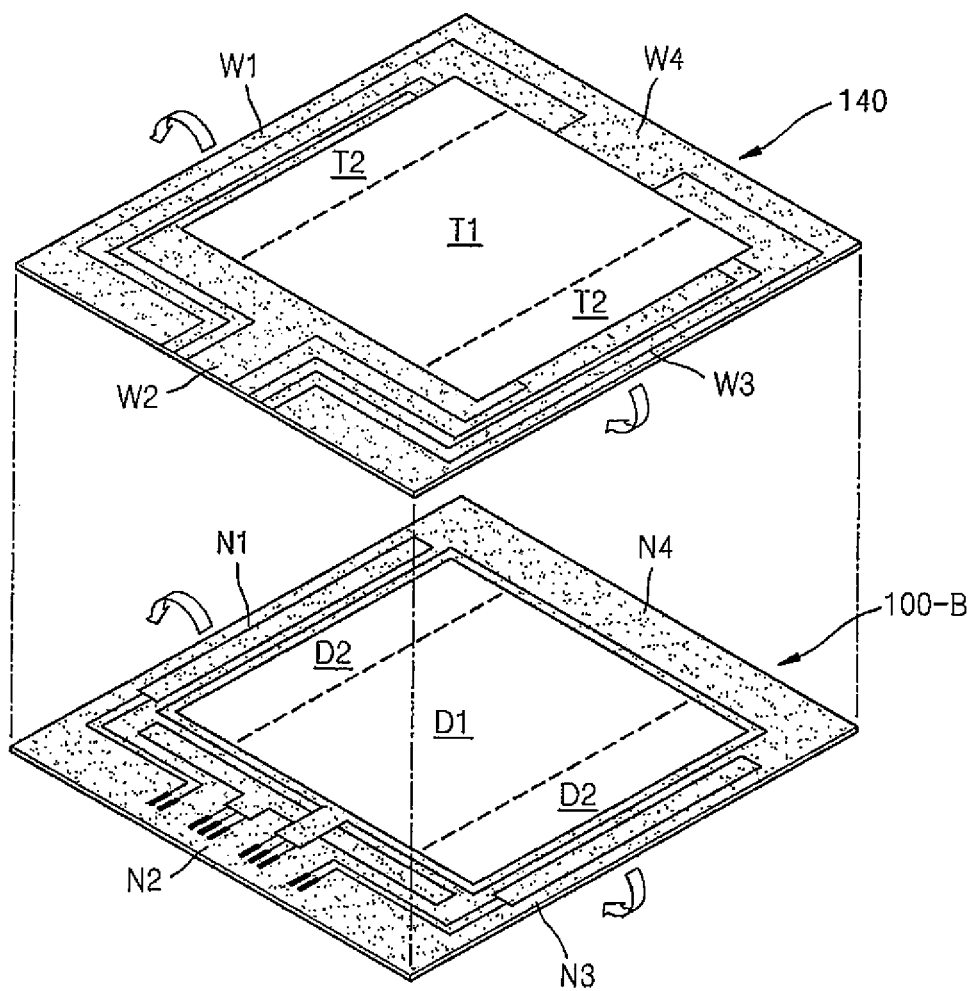
FIG. 17 is an exploded perspective view of the flexible display panel-integrated touch panel illustrated in FIG. 16.

FIG. 15 is a cross-sectional view of a flexible display panel-integrated touch panel 300 according to another embodiment of the present invention, and FIG. 16 is a cross-sectional view of a flexible display panel-integrated touch panel 300-B before non-display regions of the flexible display panel-integrated touch panel 300 illustrated in FIG. 15 are folded, and FIG. 17 is an exploded perspective view of the flexible display panel-integrated touch panel 300-B illustrated in FIG. 16.

Hereinafter, the current embodiment will be described with respect to its differences to the embodiments of FIGS. 1, 13, and 15.

Referring to FIG. 15, the flexible display panel-integrated touch panel 300 according to the current embodiment of the present invention is constituted by attaching a touch panel 140 to the flexible display panel 100 illustrated in FIG. 1.

Referring to FIGS. 16 and 17, the touch panel 140 includes a first touch region T1, second touch regions T2, and wiring regions W1, W2, W3 and W4 outside the first touch region T1 and the second touch regions T2. The touch panel 140 according to the current embodiment may use a variety of touch methods using capacitance overlay, a resistance film, and the like.

A flexible display panel 100-B before non-display regions N1 and N3 are folded includes a first display region D1 and second display regions D2, and non-display regions N1, N2, N3, and N4 outside the first display region D1 and the second display region D2.

The first touch region T1 of the touch panel 140 and the first display region D1 of the flexible display panel 100-B are aligned with each other so as to correspond to each other and the second touch regions T2 of the touch panel 140 and the second display regions D2 of the flexible display panel 100-B are aligned with one another so as to correspond to one another so that the touch panel 140 and the flexible display panel 100-B are combined with each other.

In the flexible display panel 100-B combined with the touch panel 140, the second display regions D2 on right and left sides of the first display region D1 provide a wide display screen to a user.

In addition, in the flexible display panel 100-B combined with the touch panel 140, because the non-display regions N1 and N3 connected to the second display regions D2 are folded towards the first display region D1 from the second display regions D2, the non-display regions N1 and N3 are not recognized, and the user may recognize that the second display regions D2 defined by the non-display regions N1 and N3 are almost borderless.

Although the flexible display panel 100-B illustrated in FIG. 6 is shown in the drawings described above, the present invention is not limited thereto. Alternatively, the flexible display panels illustrated in FIGS. 1 and 13 may also apply to the current embodiment.

Figure 18:
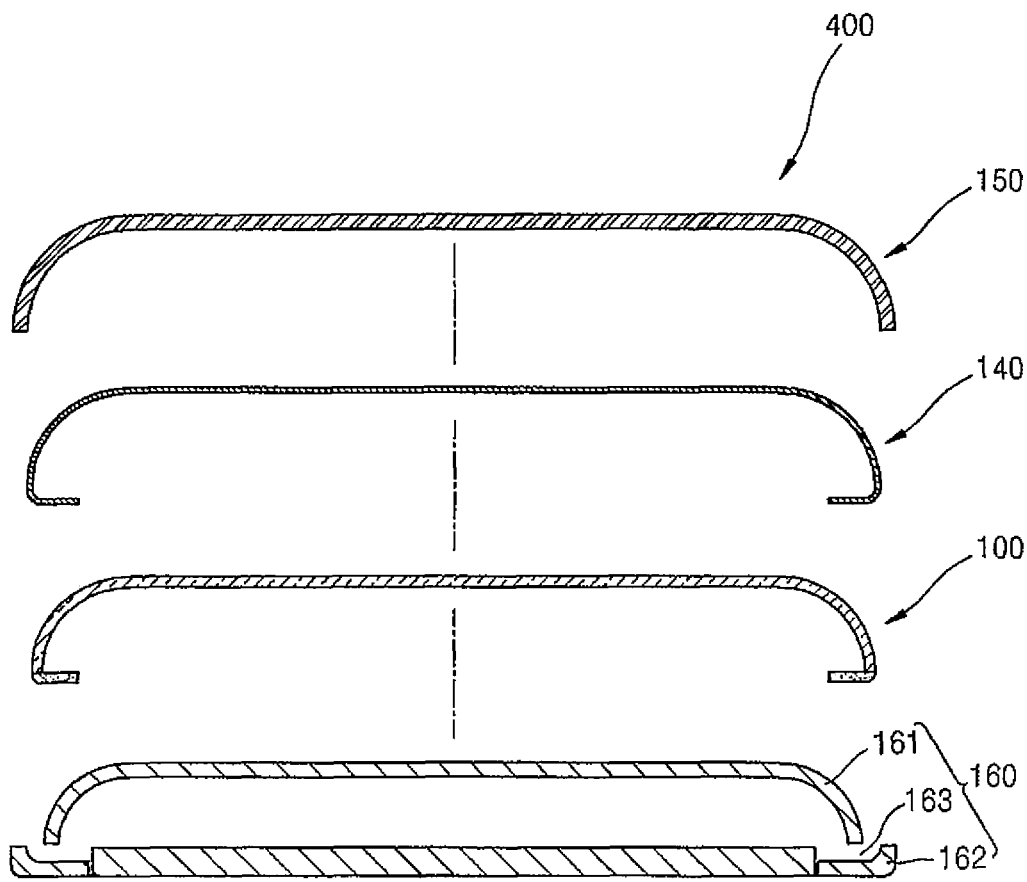
FIGS. 18 and 19 are schematic cross-sectional views of examples in which the flexible display panel of FIG. 1 is combined with a transparent protection window and a housing of a display apparatus.
Figure 19:
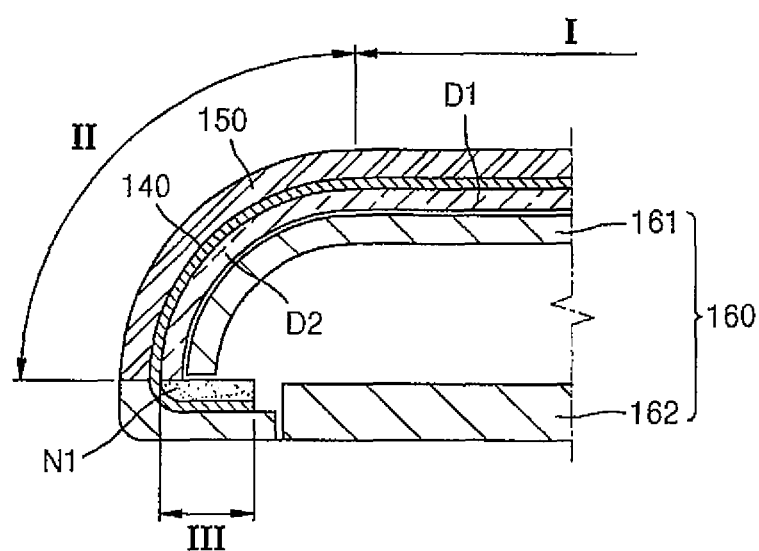

FIGS. 18 and 19 are schematic cross-sectional views of examples in which the flexible display panel 100 of FIG. 1 is combined with a transparent protection window 150 and a housing of a display apparatus. For convenience of explanation, the flexible display panel 100 of FIG. 1 is exemplified. However, the present invention is not limited thereto and may also apply to the flexible display panel-integrated touch panel 300 illustrated in FIG. 15.

Referring to FIGS. 18 and 19, the flexible display panel 100 is attached to a touch panel 140 and then, a non-display region N1 of the flexible display panel 100 is folded, and the flexible display panel 100 is bent in such a way that second display regions D2 of the flexible display panel 100 are formed as a curved surface.

The flexible display panel 100 that has the touch panel 140 attached thereto is protected and supported by the transparent protection window 150.

The transparent protection window 150 may be attached to the flexible display panel 100 to correspond to a shape of the flexible display panel 100, i.e., to correspond to a top surface of the flexible display panel 100 on which an image is displayed and a folded shape of the flexible display panel 100. In other words, the transparent protection window 150 may be combined with the flexible display panel 100 and the touch panel 140 so as to correspond to shapes of the first and second display regions D1 and D2 of the flexible display panel 100 and the first and second touch regions T1 and T2 of the touch panel 140. The transparent protection window 150 has transmittance that allows light to transmit through a display screen of the flexible display panel 100 and has a strength that maintains the shape of a curved shape of the flexible display panel 100. Thus, the transparent protection window 150 may protect the flexible display panel 100 and/or the touch panel 140 from external shock or scratches and may function as a support unit that maintains the curved shape of the flexible display panel 100 and/or the touch panel 140.

The support unit that maintains the curved shape of the flexible display panel 100 and/or the touch panel 140 is not limited to the transparent protection window 150. The curved shape of the flexible display panel 100 and/or the touch panel 140 may be maintained by a frame or a housing 160 of a display apparatus that will be described below. However, a variety of other support units may be used.

Further, an adhesive may be injected between the flexible display panel 100 and the transparent protection window 150.

The flexible display panel 100 including the transparent protection window 150 and the touch panel 140 attached thereto is combined with a display apparatus. The display apparatus may include a frame or housing 160 for protecting and supporting the display apparatus. In the current embodiment, the flexible display panel 10 is attached to a top surface of a front case 161 of the housing 160, and the non-display regions N1 and N3 described above are folded and seated on an opening 163 formed between the front case 161 and a lower case 162 of the housing 160 so that the non-display regions N1 and N3 are prevented from being seen from outside the display apparatus.

The examples of FIGS. 18 and 19 are illustrative of an example in which the flexible display panel 100 is combined with the display apparatus, and various applications may be performed by one of ordinary skill in the art.

As described above, the flexible display panel that has its concave curved shape maintained by various support units may be integrated with various display apparatuses, such as TVs, computer monitors, PDAs, smartphones, and the like. Thus, the ratio of non-display regions to a display region of the flexible display panel recognized by a user is significantly decreased so that an enlarged image screen compared to other display apparatuses may be provided. In addition, a lateral side of the display apparatus is formed as a curved surface so that an improved sense of grip or beauty may be provided to the user.

A display apparatus according to the embodiments described above has the following effects. First, an auxiliary display region that extends from a main display region of a display region is formed at a side of a display panel so that the size of a display screen is increased. Second, the subsidiary display region is formed as a curved surface so that a sense of grip is improved. Third, the auxiliary display region is formed as a curved surface so that a sense of beauty is improved. Fourth, a non-display region is not recognized by a user in the main display region so that the display region is recognized as being borderless.

While this invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A flexible display panel comprising:
    a flexible substrate comprising:
        a first display region; and
        second display regions extending from the first display region and having a curved surface; and
    an encapsulation member encapsulating at least one of the first display region and the second display regions; and
    a touch panel located on at least one side of the flexible substrate and the encapsulation member.

2. The flexible display panel of claim 1, wherein the first display region and the second display regions are continuous in the flexible substrate such that there is an indistinguishable border between the first display region and each of the second display regions.

3. The flexible display panel of claim 1, wherein the first display region and the second display regions are configured to display input signals input by a single image signal input unit.

4. The flexible display panel of claim 1, wherein the first display region and the second display regions are configured to display input signals input by different image signal input units.

5. The flexible display panel of claim 1, wherein a curvature radius of the curved surface of each the second display regions is substantially identical.

6. The flexible display panel of claim 5, wherein the curvature radius of the curved surface is greater than or equal to about 0.01 mm and is less than or equal to about 20 mm.

7. The flexible display panel of claim 5, wherein the curved surface is arc-shaped.

8. The flexible display panel of claim 5, wherein an angle formed by a boundary between the first display region and a respective one of the second display regions to an edge of the respective one of the second display regions is between about 0° and about 90°.

9. The flexible display panel of claim 1, wherein the first display region is substantially planar.

10. The flexible display panel of claim 1, further comprising a third region extending from each of the second display regions in a direction generally towards the first display region, wherein the third region includes a non-display region comprising a circuit unit for transmitting a signal to at least one of the first display region and the second display region.

11. The flexible display panel of claim 10, wherein the third region is oriented so that it is not visible to a user looking at the first display region from a first direction.

12. The flexible display panel of claim 10, wherein the third region is substantially parallel to a surface of the first display region.

13. The flexible display panel of claim 1, wherein at least one of the first display region and the second display regions comprise an organic light-emitting device.

14. The flexible display panel of claim 1, further comprising a barrier layer located between the flexible substrate and the encapsulation member.

15. The flexible display panel of claim 1, wherein the encapsulation member is a flexible thin encapsulation layer.

16. The flexible display panel of claim 1, further comprising a support unit for maintaining a shape of the flexible display panel.

17. The flexible display panel of claim 16, wherein the support unit is a transparent protection window located on the encapsulation member.

18. The flexible display panel of claim 1, wherein the touch panel comprises a flexible film that generally corresponds to a shape of the flexible display panel.

19. The flexible display panel of claim 18, wherein the touch panel comprises:
 touch regions in the flexible film that generally correspond to the first display region and the second display regions; and
 wiring regions outside the touch regions.

20. A display apparatus comprising:
 a flexible display panel comprising:
  a first display region; and
  second display regions extending from the first display region and facing a different direction from the first display region; and
 a support member for maintaining a shape of the flexible display panel;
 an encapsulation thin layer on the flexible display panel; and
 a touch panel on the encapsulation thin layer and comprising touch regions generally corresponding to the first display region and the second display regions, wherein at least one organic light-emitting device is located in the first display region or in at least one of the second display regions.

21. The display apparatus of claim 20, further comprising a transparent protection window located on the touch panel generally corresponding to the first display region and the second display regions of the flexible display panel.

22. The display apparatus of claim 20, wherein the second display regions have a curved surface.

23. The display apparatus of claim 20, further comprising non-display regions extending generally towards the first display region from the second display region and being invisible from a front of the first display region, wherein at least one of the non-display regions comprises a circuit unit for transmitting a signal to at least one of the first display region and the second display region.

* * * * *